(12) United States Patent
Wei et al.

(10) Patent No.: US 8,603,893 B1
(45) Date of Patent: Dec. 10, 2013

(54) METHODS FOR FABRICATING FINFET INTEGRATED CIRCUITS ON BULK SEMICONDUCTOR SUBSTRATES

(75) Inventors: Andy C. Wei, Queensbury, NY (US); Francis C. Tambwe, Malta, NY (US); Frank Scott Johnson, Wappingers Falls, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/474,443

(22) Filed: May 17, 2012

(51) Int. Cl.
*H01L 21/76* (2006.01)

(52) U.S. Cl.
USPC .................................. 438/424; 257/E21.546

(58) Field of Classification Search
USPC .................................. 438/424; 257/E21.546
See application file for complete search history.

(56) References Cited

U.S. PATENT DOCUMENTS

| | | | |
|---|---|---|---|
| 7,994,583 B2* | 8/2011 | Inaba | 257/369 |
| 2008/0188080 A1* | 8/2008 | Furukawa et al. | 438/694 |
| 2011/0284991 A1* | 11/2011 | Hijioka et al. | 257/532 |
| 2012/0025316 A1* | 2/2012 | Schultz | 257/368 |
| 2013/0119482 A1* | 5/2013 | Wann et al. | 257/401 |

* cited by examiner

*Primary Examiner* — William D Coleman
*Assistant Examiner* — Christine Enad
(74) *Attorney, Agent, or Firm* — Ingrassia Fisher & Lorenz, P.C.

(57) ABSTRACT

Methods are provided for fabricating FinFET integrated circuits on bulk semiconductor substrates. In accordance with one embodiment a patterned hard mask that defines locations of a regular array of a plurality of fins is formed overlying a semiconductor substrate. Portions of the patterned hard mask are removed using a cut mask to form a modified hard mask. The substrate is etched using the modified hard mask as an etch mask to form a plurality of fins extending upwardly from the substrate and separated by trenches. Selected ones of the plurality of fins are at least partially removed to form isolation regions and an insulating material is deposited to fill the trenches and to cover the at least partially removed selected ones of the plurality of fins.

15 Claims, 9 Drawing Sheets

→ y

METHODS FOR FABRICATING FINFET INTEGRATED CIRCUITS ON BULK SEMICONDUCTOR SUBSTRATES

TECHNICAL FIELD

The present invention generally relates to methods for fabricating FinFET integrated circuits, and more particularly relates to methods for fabricating and isolating FinFET integrated circuits on bulk semiconductor substrates.

BACKGROUND

As integrated circuits (ICs) become larger and larger it becomes necessary to consider structures other than planar transistors to accommodate the ever increasing number of transistors that the circuits require. One such structure is the FinFET, a field effect transistor (FET), in which the channel of the transistor is formed along the vertical sidewalls of a thin semiconductor fin that extends upwardly from a semiconductor substrate. Because the channel is formed along a vertical fin sidewall rather than along the horizontal surface of the wafer, a wide channel (and hence high performance) can be achieved without increasing the horizontal surface area of the semiconductor substrate.

The fabrication of FinFET ICs, however, encounters some processing problems. Fin fabrication requires etching trenches into a semiconductor substrate to produce the vertical fins. The fins are usually formed in a wide array that extends across an entire IC chip. Among the problems encountered are the loading effects that arise when etching a plurality of fins. Larger open areas have a tendency to produce wide fins and deep trenches while more closely spaced fins are thin with much shallower trenches. Such variance in fin width and trench depth makes reliable processing difficult because the etch results become layout and thus product dependent. A common solution to the etch pattern loading problem is to include dummy fins to achieve a regular array in which all fins can be etched equally. If the FinFET is fabricated on a semiconductor-on-insulator (SOI) substrate, the removal of the dummy fins to achieve the necessary fin-fin electrical isolation is relatively easy. On bulk semiconductor wafers, however, such dummy fin removal and electrical isolation is not easy.

Accordingly, it is desirable to provide methods for fabricating FinFET integrated circuits on bulk semiconductor substrates. In addition, it is desirable to provide methods for fabricating FinFET integrated circuits having the necessary electrical isolation between fins. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating FinFET integrated circuits on bulk semiconductor substrates. In accordance with one embodiment a patterned hard mask that defines locations of a regular array of a plurality of fins is formed overlying a semiconductor substrate. Portions of the patterned hard mask are removed using a cut mask to form a modified hard mask. The substrate is etched using the modified hard mask as an etch mask to form a plurality of fins extending upwardly from the substrate and separated by trenches. Selected ones of the plurality of fins are at least partially removed to form isolation regions and an insulating material is deposited to fill the trenches and to cover the at least partially removed selected ones of the plurality of fins.

In accordance with a further embodiment, a semiconductor substrate is provided and a patterned hard mask is formed overlying the semiconductor substrate, the patterned hard mask defining locations of a plurality of parallel fins extending in a first direction. A first etch mask exposing a first portion of the patterned hard mask is formed overlying a logic portion of the integrated circuit and a second portion of the patterned hard mask is formed overlying a memory portion of the integrated circuit, the first mask extending in a second direction including a portion substantially perpendicular to the first direction. Portions of the patterned hard mask are etched using the first etch mask to remove the first portion and the second portion. The semiconductor substrate is etched using remaining portions of the patterned hard mask as an etch mask to form a plurality of semiconductor fins separated by etched trenches. A second etch mask is formed overlying the plurality of semiconductor fins and portions of the plurality of semiconductor fins exposed through the second etch mask are etched to at least partially remove portions of the plurality of semiconductor fins. An insulator material is deposited to fill the trenches and to cover the etched portions of the plurality of semiconductor fins.

In accordance with yet another embodiment, a semiconductor substrate is provided and a first mask is formed overlying the semiconductor substrate and defining a plurality of parallel fin locations extending in a first direction and selectively cut in a second direction. The semiconductor substrate is etched using the first mask as an etch mask to form a plurality of parallel fins extending in a first direction and separated by etched trenches, at least selected ones of the parallel fins being terminated in the second direction. A second mask is formed overlying the fins and exposing dummy ones of the plurality of parallel fins. At least a portion of the dummy ones of the plurality of parallel fins are etched to reduce the height thereof, and the trenches are filled and the etched dummy fins are covered with an insulating material.

BRIEF DESCRIPTION OF THE DRAWINGS

The present invention will hereinafter be described in conjunction with the following drawing figures, wherein like numerals denote like elements, and wherein:

FIGS. 2-5, 7, 8, 10-12, and 15-20 are cross-sectional views; FIGS. 6, 9, 13, and 14 are top views.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1A:
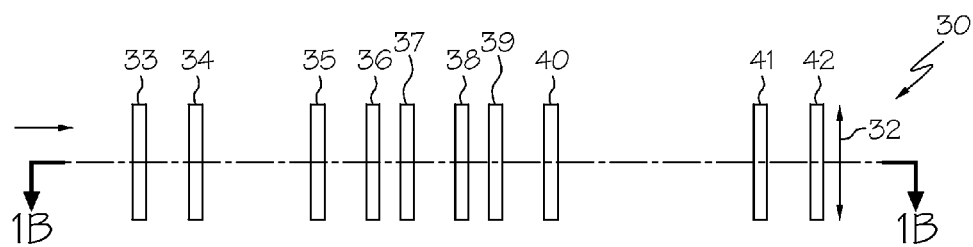
FIG. 1 illustrates the problem of etch pattern loading that can arise when etching a pattern that includes both open and dense areas.
Figure 1B:
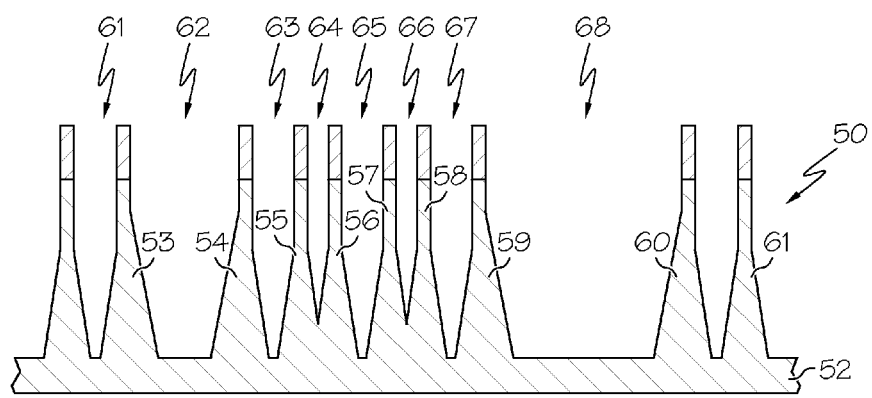

Methods are provided for the fabrication of FinFET integrated circuits (ICs) in accordance with various embodiments. The embodiments described and illustrated below will find application in ICs of all sizes, but are particularly useful in the fabrication of large ICs such as those that incorporate both logic circuits (which will likely vary greatly from design to design and across a design) and memory circuits such as static random access memory (SRAM) circuits (that will likely be very uniform across a design and from design to design). The memory circuit portion of an IC is fabricated in an array of fins and is somewhat tolerant of etch pattern loading because the memory circuit portion is usually a highly regular array of memory cells that may be repeated many thousands of times across the IC. Because the array of memory cells is so regular, both on a particular circuit design and from design to design, any variations that result from etch pattern loading can be at least partially compensated for in the design of the memory cell. The logic portion of a FinFET IC is fabricated in an array of closely spaced fins (usually more closely spaced than in the memory portion) in which etch pattern loading must be minimized. Etch pattern loading can cause variances in the width of fins and in the depth of the trenches between fins. The effects of etch pattern loading is illustrated in FIG. 1. The top portion of FIG. 1, FIG. 1A, illustrates a patterned hard mask 30 in top view as it is applied overlying a semiconductor substrate. Such a patterned hard mask could extend for a considerable distance, perhaps even across the entire chip, in the direction indicated by double headed arrow 32. Note the difference in spacing between the hard mask segments 33 and 34 in contrast to the spacing between hard mask segments 34 and 35, 36 and 37, 38 and 39, and 40 and 41. The bottom portion of FIG. 1, FIG. 1B, is a cross sectional view taken along the line 1B-1B and illustrates the result of etching a plurality of fins 50 from a semiconductor substrate 52 using the patterned hard mask 30 as an etch mask. Fins 53, 54, 59, and 60 are wider than fins 55, 56, 57, and 58. The shapes of the fins also vary. In addition, the depth of trenches 61, 62, 63, 65, 67, and 68 is greater than the depth of trenches 64 and 66 between the fins. Such variances cause non-uniformity in device characteristics and can lead to circuit failure. Because the logic portion of the IC varies greatly across an IC (different cells, gates, and the like) and from IC design to IC design, the variances cannot be compensated for by changes in the logic design. Accordingly, etch pattern loading must be minimized especially in the logic portion of an IC. Etch pattern loading can be minimized by providing for a uniform array of uniformly spaced fins in the logic portion of the IC and a uniform array of uniformly spaced fins in the memory portion of the IC. The uniformly spaced fins in the logic portion of the IC all have the same line-space pitch. Similarly, the uniformly spaced fins in the memory portion of the IC all have the same line-space pitch, although it is not necessary that the line-space pitch be the same in both the logic and memory portions of the IC. In general the line-space pitch will be smaller in the logic portion than in the memory portion. Maintaining the same line-space pitch to minimize etch pattern loading requires the provision of dummy fins to preserve the uniformity of the arrays.

FIGS. 2-20 illustrate methods for fabricating a FinFET integrated circuit 70 in accordance with various embodiments. Various steps in the fabrication of FinFET semiconductor integrated circuits are well known and so, in the interest of brevity, many conventional fabrication steps will only be mentioned briefly herein or will be omitted entirely without providing the well-known process details.

Figure 2:
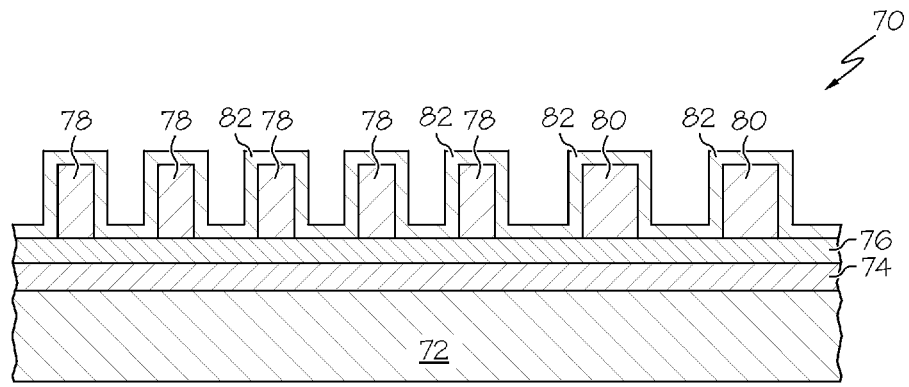
FIGS. 2-20 schematically illustrate method steps, in accordance with various embodiments, for fabricating a FinFET integrated circuit.

FIG. 2 illustrates, in cross section, a portion of FinFET IC 70 at an early stage of fabrication in accordance with one embodiment. IC 70 is fabricated in and on a bulk semiconductor substrate 72. Semiconductor substrate 72 can be, for example, a wafer of silicon, silicon admixed with germanium or other elements, or other semiconductor material commonly used in the fabrication of ICs. Although not illustrated, n-type and p-type wells are formed in semiconductor substrate 72, for example by the implantation of dopant ions, to form regions in which P-channel and N-channel FETs (PFETs and NFETs, respectively) will be formed. A layer of silicon nitride or other hard mask material 74 is deposited overlying the semiconductor substrate, and a layer 76 of silicon oxide or other insulating material is deposited overlying the layer of hard mask material. A layer of mandrel-forming material is deposited overlying layer 76. The mandrel-forming material can be, for example, polycrystalline or amorphous silicon. The mandrel-forming material is patterned to form individual mandrels 78, 80. Mandrels 78 have a narrow width and pitch as appropriate for the logic portion of IC 70 and mandrels 80 have a wider width and pitch as appropriate for the memory portion of the IC. The mandrels can be patterned in conventional manner, for example by depositing a layer of hard mask material such as silicon nitride, patterning the hard mask material photolithographically, and using the patterned hard mask layer as an etch mask to pattern the mandrel-forming material. After patterning mandrels 78 and 80, the patterned hard mask layer and the photoresist used to pattern it are removed. A nitride hard mask material can be removed, for example, in hot phosphoric acid. Layer 76 protects hard mask layer 74 during the removal of the patterned hard mask layer. A layer of masking material 82 such as a layer of silicon nitride having a thickness of about 12-15 nanometers (nm) is deposited, for example by atomic layer deposition (ALD), overlying the mandrels 78 and 80. Layer 82 will be used in forming a mask for the etching of the fins, so control of the thickness of the layer is important. ALD is an ideal technique for the deposition of layer 82 because of the precise thickness control that can be achieved with ALD.

Figure 3:
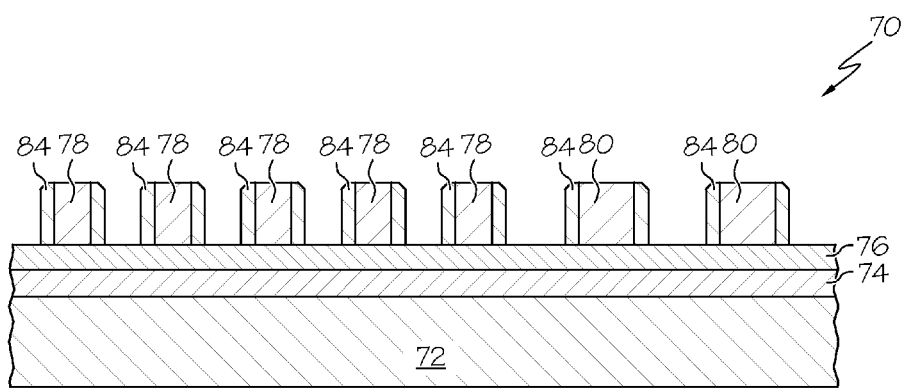
Figure 4:
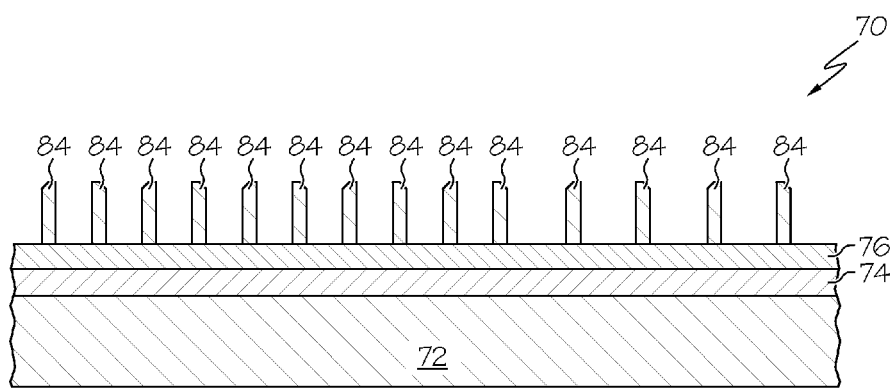

The method for fabricating FinFET IC 70 continues, in accordance with one embodiment, as illustrated in FIGS. 3 and 4. Layer 82 is anisotropically etched, for example by reactive ion etching (RIE) to form sidewall spacers 84 on the sidewalls of mandrels 78 and 80. Mandrels 78 and 80 are then removed by etching in an etchant that preferentially etches the mandrel-forming material at a substantially faster etch rate than the etch rate of either sidewall spacers 84 or insulating layer 76. The ability to etch the mandrel-forming material without substantially etching either the sidewall spacers or the insulating layer is one criterion to be used in selecting the materials for each element. Those of skill in the art know that there are numerous materials available for each element.

Figure 5:
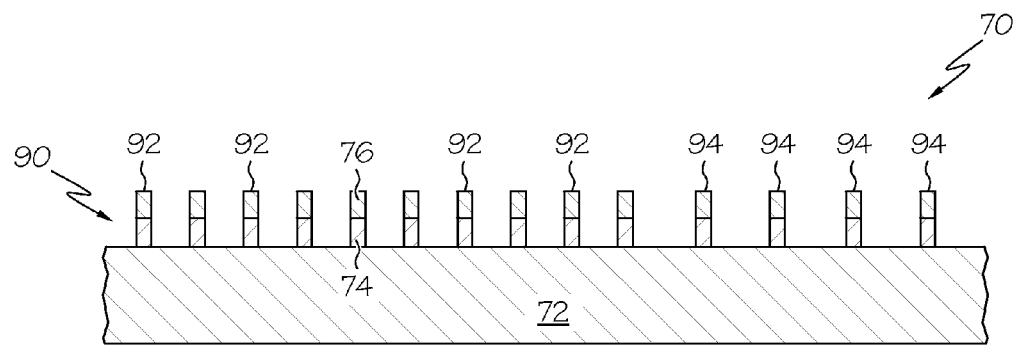

As illustrated in FIG. 5, in a process known as sidewall image transfer (SIT), sidewall spacers 84 are used as an etch mask to first etch insulator layer 76 and then hard mask layer 74. In accordance with one embodiment, if the sidewall spacers and hard mask layer are silicon nitride and the insulator layer is silicon oxide, the oxide can be etched in an HF based etchant that doesn't substantially etch nitride and the nitride can be etched in hot phosphoric acid that doesn't substantially etch the oxide. The nitride sidewall spacer is usually consumed while etching the hard mask layer. As a result of the SIT process a patterned hard mask 90 is formed that will define the locations of a regular array of a plurality of fins. Hard mask 90 includes a plurality of elements 92 having a relatively narrow line-space pitch that will define the locations of a plurality of fins in a logic portion of IC 70 and a plurality of elements 94 having a relatively wider line-space pitch that will define the locations of a plurality of fins in a memory portion of IC 70. The hard mask including elements 92 and 94 includes a plurality of elongated, substantially parallel hard masks extending in a first direction (into the plane of the FIGURE).

When semiconductor fins are formed everywhere in order to minimize etch pattern loading and to maintain fin etch uniformity, selected fins and portions of fins (both collectively referred to as "dummy fins") must be cut away where the fins are not electrically necessary. Dummy fins are reduced in height so as to effectively be removed and active fins remain. In the direction parallel to the fins (the X-direction as indicated in subsequent FIGURES) dummy fins must be removed to provide isolation between transistors of opposite polarity (NFET and PFET). In the direction perpendicular to the fins (the Y-direction) dummy fins must be removed to provide isolation between transistors of the same polarity. It would be difficult to entirely remove the necessary dummy fins in both the X- and Y-directions and to still maintain the necessary dimensional controls. An etchant would be required that can non-selectively etch a planarizing layer, oxide, nitride, and semiconductor material to a depth of 300-400 nm while maintaining critical dimensions and overlay tolerances within a line-space pitch of only 40-50 nm.

Figure 6:
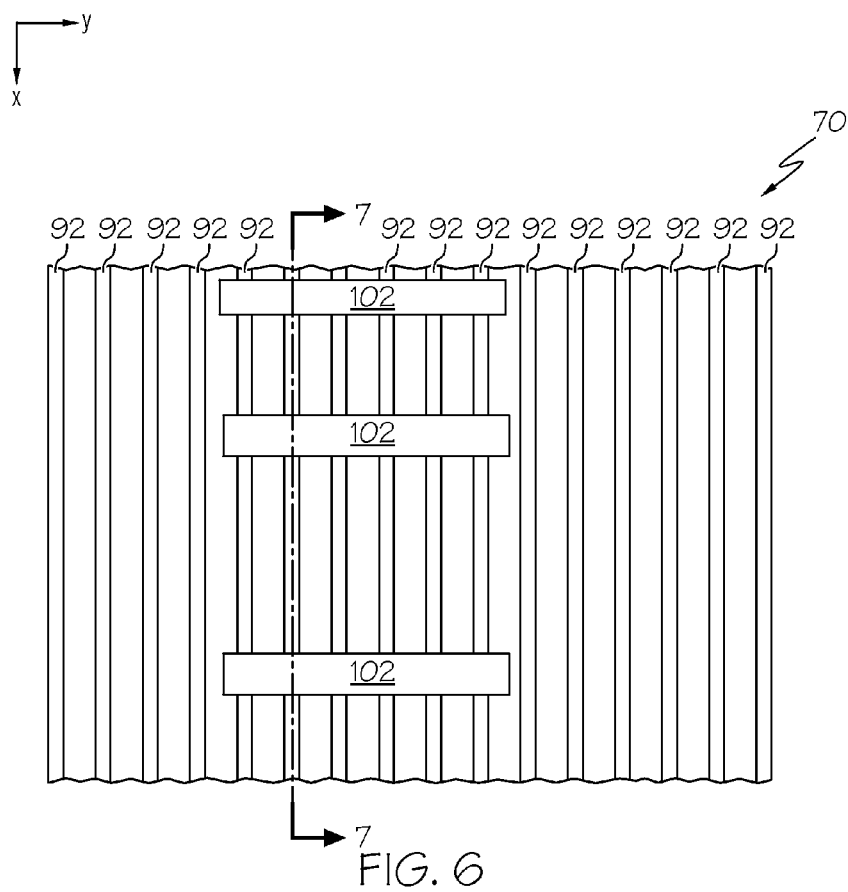
Figure 9:
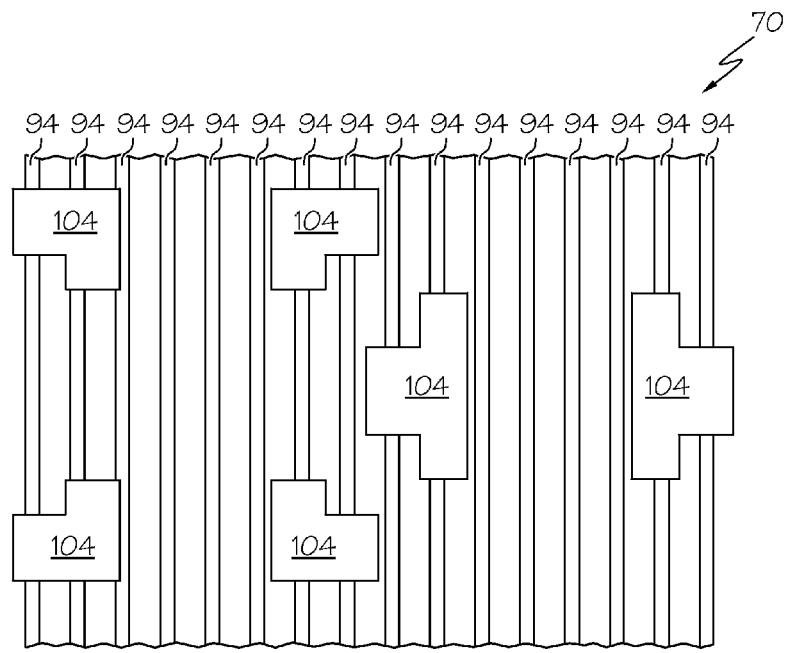

FIGS. 6 and 9 illustrate, in top view, a portion of the logic portion and the memory portion of IC 70, respectively, in accordance with one embodiment. In accordance with this embodiment a mask 106 (illustrated in FIG. 7) is provided overlying the patterned hard masks and exposing a portion 102 of patterned hard mask 92 and a portion 104 of patterned hard mask 94, each having at least a portion extending in the Y-direction. Mask 106 can be, for example, a patterned layer of photoresist.

Figure 7:
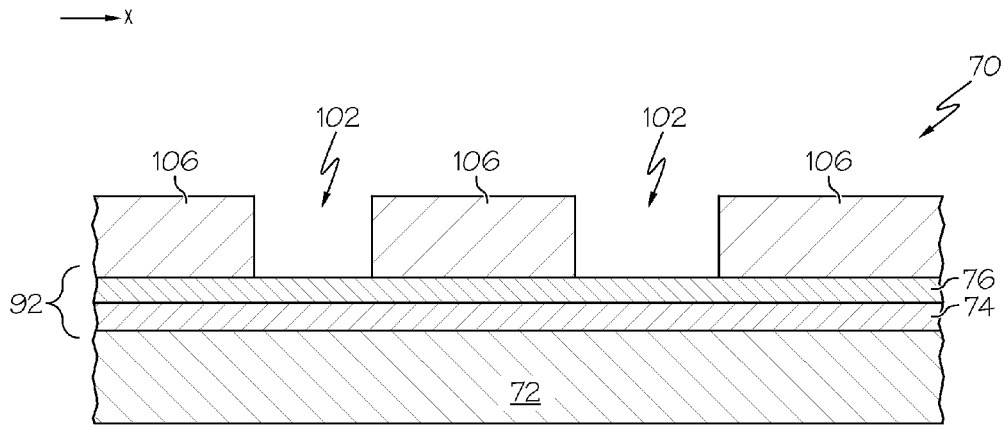
Figure 8:
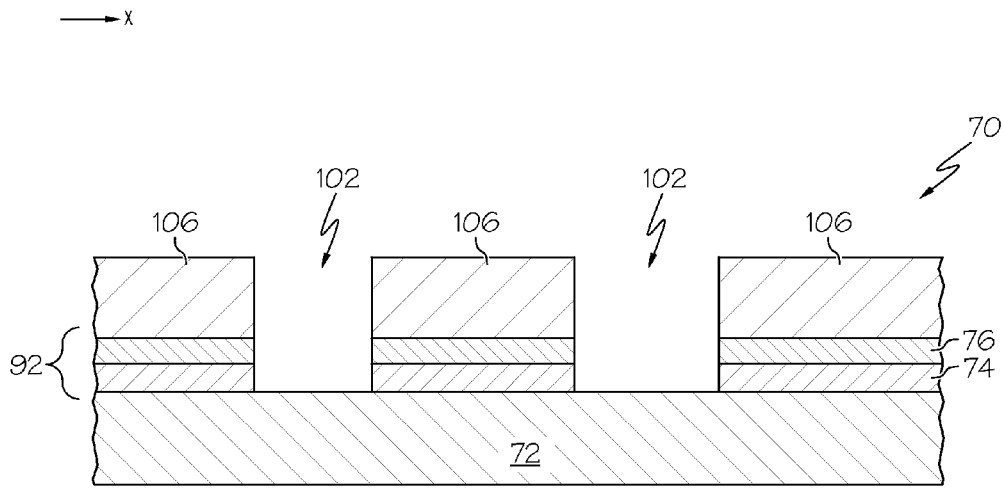

FIGS. 7 and 8 illustrate, in cross section through the logic portion of FinFET IC along the line 7-7, continuing steps in the method in accordance with one embodiment. FIG. 7 illustrates the positioning of mask 106 overlying patterned hard mask 92 and exposing portions 102 of the hard mask. As illustrated in FIG. 8, mask 106 is used as an etch mask and portions of patterned hard mask 92 are removed to form a modified hard mask 192. Although not illustrated, the same etching step is used to remove exposed portions 104 of patterned hard mask 94 using mask 106 (see FIG. 9) as the etch mask. The modified hard mask thus includes a regular array of mask areas extending across both the logic and memory portions of FinFET IC 70 that are selectively cut in the Y-direction.

Figure 10:
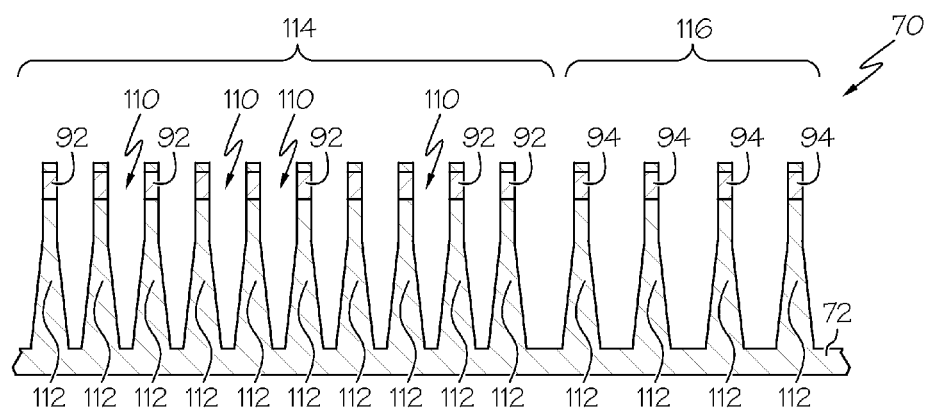

The method for fabricating a FinFET IC in accordance with one embodiment continues by using the modified hard mask as an etch mask to etch deep trenches 110 into semiconductor substrate 72 to form a plurality of semiconductor fins 112 extending upwardly from the substrate and separated by the trenches 110 as illustrated in cross section in FIG. 10. FIG. 10 is taken along the same cross section as is FIG. 5 and includes a logic portion 114 and a memory portion 116. Each of portions 114 and 116 includes a regular array of fins of similar line-space pitch so the fins can be etched without substantial etch pattern loading effects except perhaps at the logic-memory boundary where the line-space pitch changes. Because the patterned etch mask was modified, as explained above, fins 112 are cut or truncated in the Y-direction as required for the circuit being implemented. The cuts correspond to locations of the circuit at which isolation of transistors of the same polarity is needed. Some etch pattern loading may occur in the vicinity of these cuts, but such loading is not detrimental because the cuts are located in areas spaced apart from gate electrode structures as will be explained more fully below. Fins 112 can be etched to a depth, for example, of about 200-500 nm. Trenches 110 should be deep enough to insure proper isolation between N- and P-regions in the memory portion.

Figure 11:
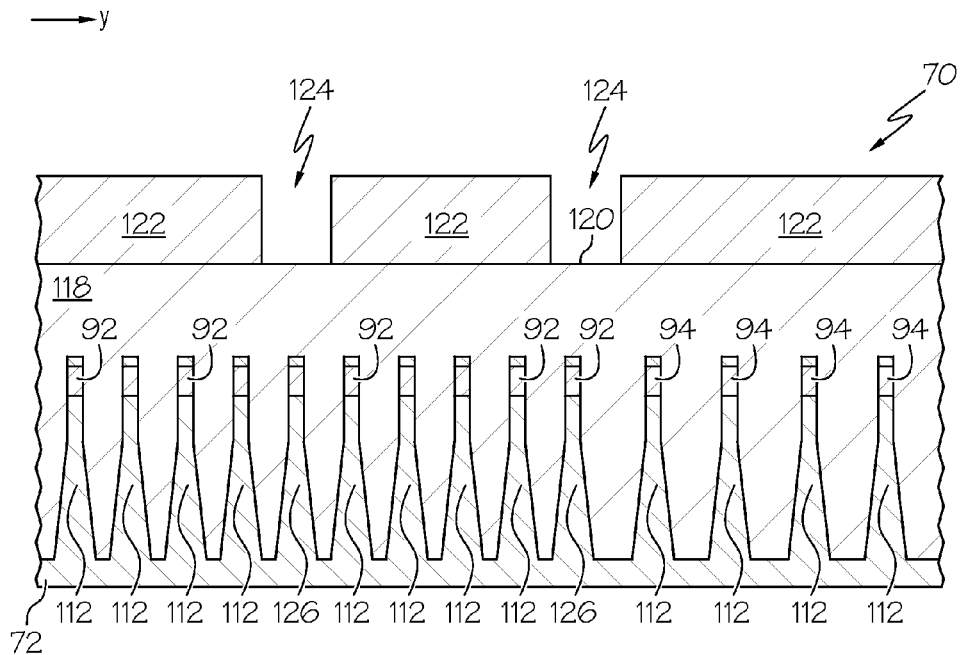

After etching trenches 110 to define fins 112, the trenches are filled with a fill material such as an organic planarizing layer (OPL) 118 as illustrated in FIG. 11. The OPL or other fill material is deposited to a sufficient thickness to completely fill the trenches between fins 112 and to provide a substantially planar surface 120 overlying the fins. A lithograph patterning layer 122 is deposited and patterned overlying surface 120. The patterning layer provides openings 124 that expose fill material 118 overlying selected dummy fins 126 that are to be etched.

Figure 12:
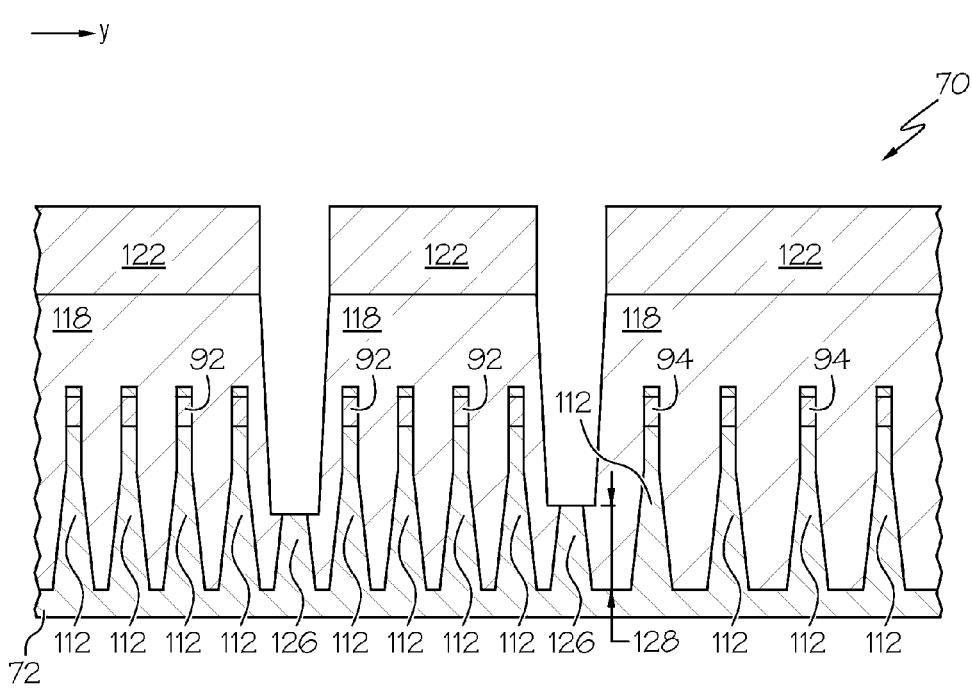

As illustrated in FIG. 12, in accordance with an embodiment, lithographic patterning layer 122 is used as an etch mask and fill material 118 and the selected dummy fins 126 are etched. The etching can be carried out with a non-selective etchant that etches both the fill material and the semiconductor fin material. Only a portion of the dummy fins needs to be etched; it is not necessary to etch the entire fin. It is sufficient to etch the dummy fins so that the remaining fin height, as indicated by arrow 128, is below the electrically active fin portion as defined below.

Figure 13:
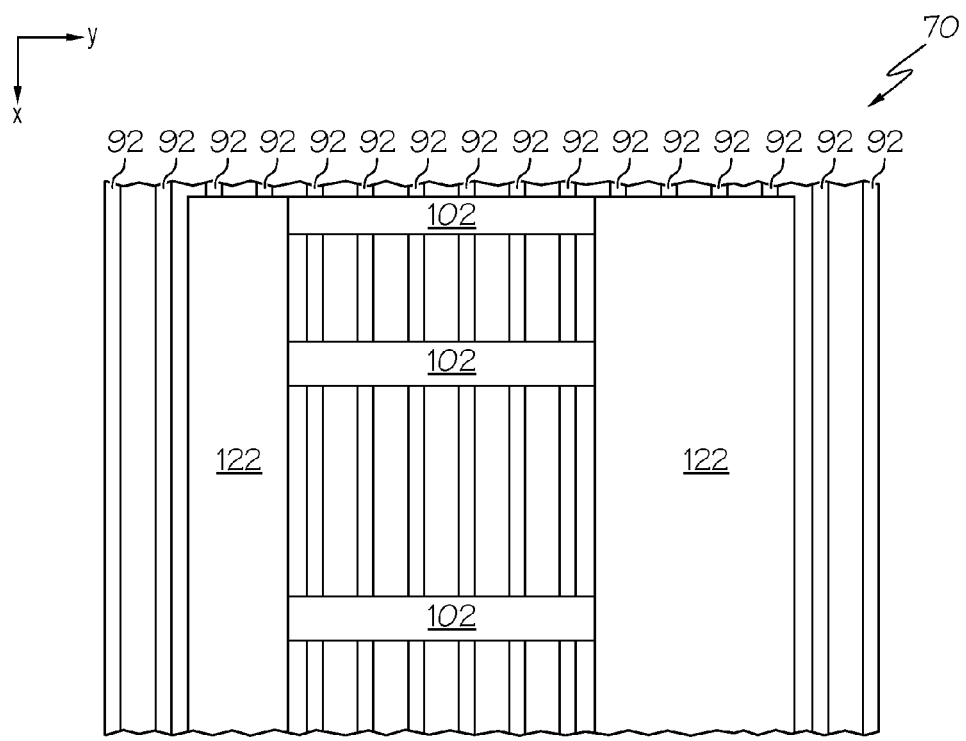
Figure 14:
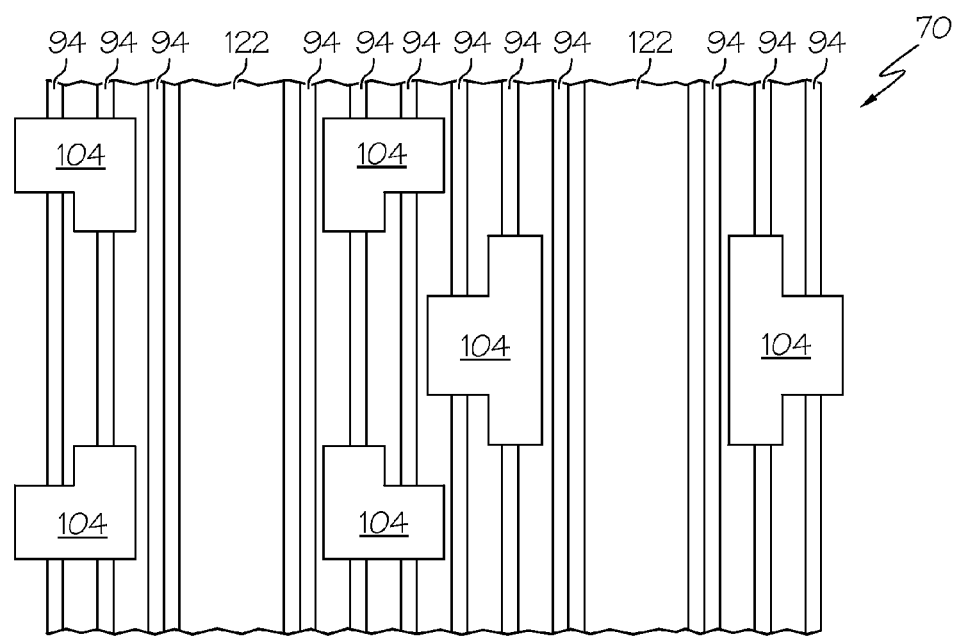

FIGS. 13 and 14 illustrate, in top view, a composite of the patterned hard masks 92 and 94, the patterned hard mask cuts 102, 104 and the lithographic patterning mask 122 for the logic and memory portions of FinFET IC 70, respectively. As stated above, the patterned hard masks 92 and 94 define the locations of an array of a plurality of semiconductor fins to be subsequently formed, patterned hard mask cuts 102 and 104 remove portions of the patterned hard masks to effect a cut of the semiconductor fins in the Y-direction, and lithographic patterning mask 122 is used to at least partially remove semiconductor fins in the X-direction.

Figure 15:
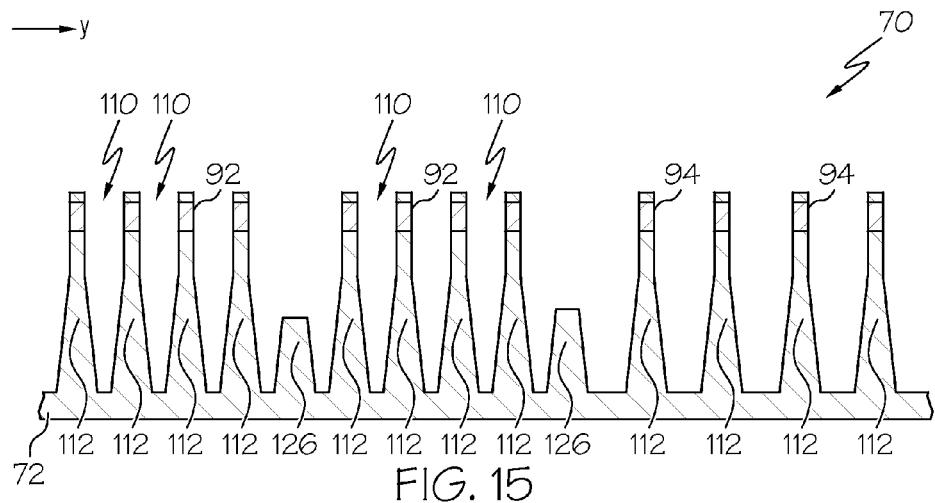
Figure 16:
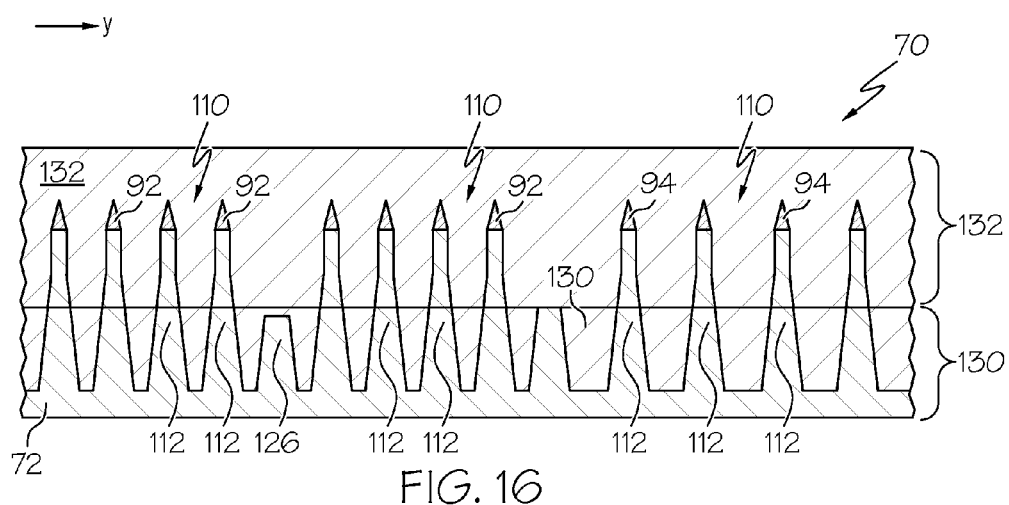

After removing the selected dummy fins using lithographic patterning layer 122, the method for fabricating a FinFET IC continues, in accordance with an embodiment, as illustrated in cross section in FIGS. 15-19. The cross sections are taken along the same line as in FIG. 5. As illustrated in FIGS. 15 and 16, the OPL or other fill material 118 is removed, trenches 110 are filled, and semiconductor fins 112 are covered with a dielectric material. In accordance with one embodiment, the trenches are partially filled with a flowable chemical vapor deposited (FCVD) insulator 130 such as a FCVD silicon oxide. As is well known, the FCVD silicon oxide tends to be a relatively soft oxide, so that material is covered with a more dense and more robust oxide such as a high density plasma (HDP) silicon oxide layer 132 that completes the filling of trenches 110 and covers semiconductor fins 112. The nature of the HPD process (cycles of deposit, etch, deposit . . . ) tends to erode the patterned hard masks 92 and 94 giving them a distinctive pointed shape.

Figure 17:
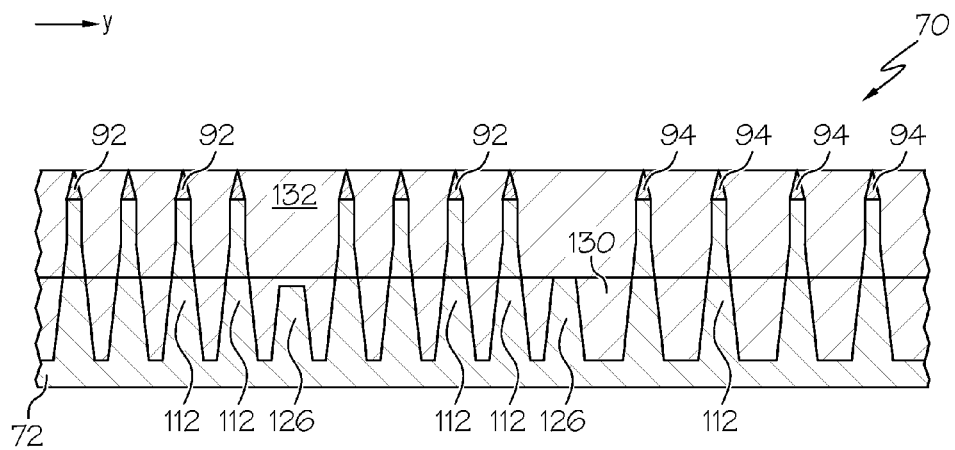
Figure 18:
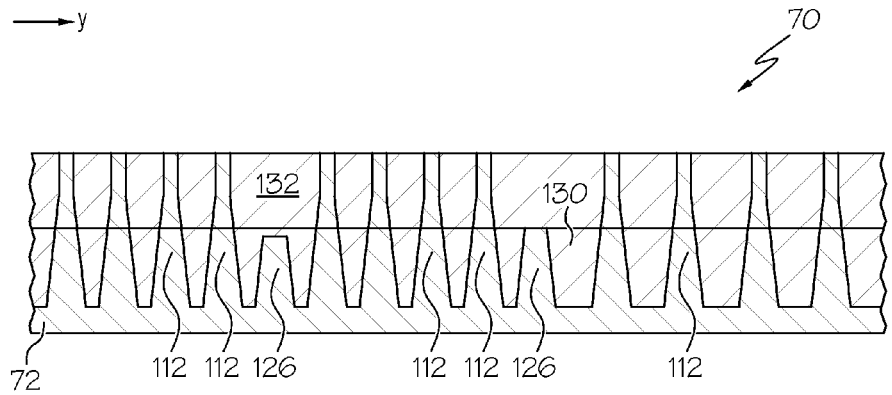

The method for fabricating a FinFET IC continues as illustrated in FIGS. 17 and 18, in accordance with one embodiment, by planarizing HDP silicon oxide layer 132. The layer can be planarized, for example, by chemical mechanical planarization (CMP) with the CMP stopping on patterned hard mask layer 92 and 94. The CMP process and specifically the slurry employed in the planarization are adjusted to selectively stop on the hard mask material (silicon nitride) as illustrated in FIG. 17. The CMP process and the slurry employed are then changed to allow a silicon oxide/silicon nitride non-selective planarization as illustrated in FIG. 18. The planarization of this step is continued to planarize HDP silicon oxide layer 132 and to remove about 10 nm from the top of semiconductor fins 112.

Figure 19:
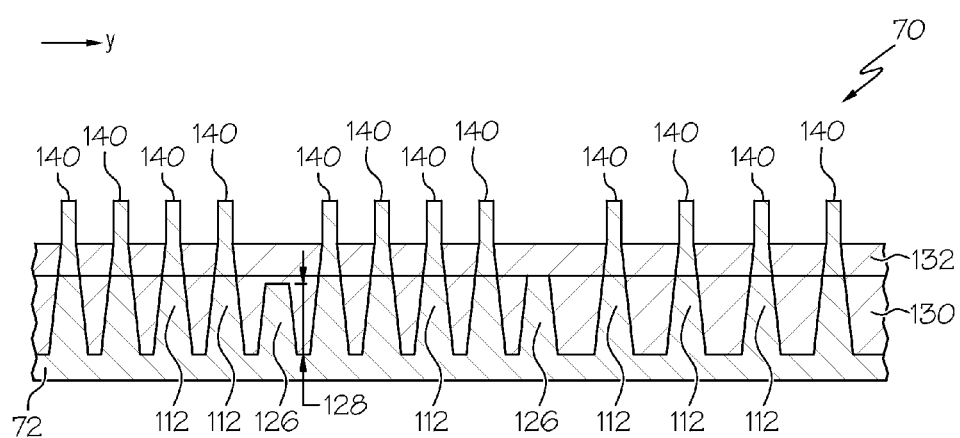

As illustrated in FIG. 19, in accordance with one embodiment, the method continues by the controlled etching of HDP silicon oxide layer 132 to expose a top portion 140 of semiconductor fins 112. The etching can be done, for example, by the well-known "controlled oxide removal" or COR sputter etch process. The COR process is an atomic-layer process that has the capability of removing a precise thickness of the HDP silicon oxide. The exposed top portion 140 of semiconductor fins 112, having a substantially straight fin profile, is the electrically active fin portion and can have a height, for example, of about 30-100 nm. An amount of HDP silicon oxide is retained such that the HDP silicon oxide covers and electrically isolates the remaining portion of dummy fins 126. That is, the remaining total thickness of HDP silicon oxide 132 and FCVD oxide 130 is of a thickness greater than the height of the remaining portion of dummy fins 126 as indicated by arrow 128.

Figure 20:
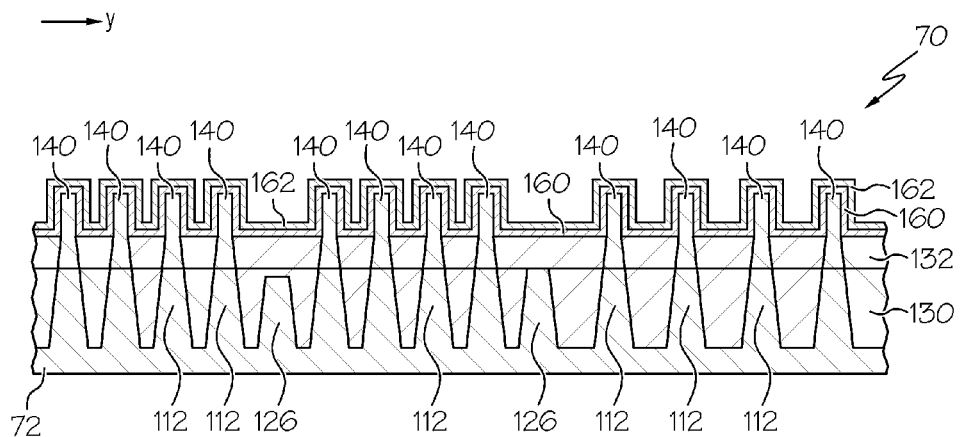

After formation of the electrically active fin portions 140 and the insulating oxide (130 plus 132) between the fins, a gate structure is formed overlying the electrically active fins as illustrated in cross section in FIG. 20. The gate structure is formed by depositing or otherwise providing a gate insulator layer 160 on the electrically active fins. The gate insulator layer can be, for example, a layer of thermally grown silicon dioxide, a layer of deposited high dielectric constant insulating material such as an oxide of hafnium, or a combination of insulating materials. A layer of gate electrode material 162 such as polycrystalline silicon, amorphous silicon, or a metal is deposited overlying the gate insulator layer. Although not illustrated, additional layers may be deposited between the gate insulating layer and the layer of gate electrode material to set the work function for the NFETs and PFETs. The gate structure is in contact with the electrically active fins, but is isolated from the partially cut dummy fins 126 by insulating oxides 130 and 132. The layer of gate electrode material 162 and gate insulator layer 160 are photolithographically patterned in conventional manner to form gate electrode structures of FinFET transistors in both the logic and memory portions of the IC. The gate structures overlie the electrically active fins 140 and define channel regions in the near surface of the fins immediately underlying the gate structures. The gate structures are formed substantially perpendicular to semiconductor fins 112 and are spaced apart from cut or truncated ends of the fins by a sufficient distance such that any etch pattern loading that may have occurred because of the cuts modifying the regular array of fins does not affect the channel region of the FinFET transistors.

In accordance with an alternate embodiment, a hard mask such as that illustrated in FIG. 5 is used as an etch mask to etch deep trenches into the semiconductor substrate to form a plurality of semiconductor fins extending upwardly from the substrate. The substantially parallel fins form an array of uniformly spaced fins of a given height that extend in one direction that are separated by deep trenches. Etching in this manner reduces etch pattern loading and helps to maintain fin etch uniformity. After forming the uniform array of fins, selected fins and portions of fins (both collectively referred to as "dummy fins") must be cut away where the fins are not electrically necessary. Dummy fins are reduced in height so as to effectively be removed and active fins remain. As in previously described embodiments, in the direction parallel to the fins (the X-direction as indicated in previous FIGURES) dummy fins must be removed to provide isolation between transistors of opposite polarity (NFET and PFET). In the direction perpendicular to the fins (the Y-direction) dummy fins must be removed to provide isolation between transistors of the same polarity.

In accordance with this alternate embodiment, an organic planarizing layer is deposited to fill the trenches between the fins. A masking layer, such as a patterned layer of photoresist is formed overlying the OPL. The masking layer is patterned with pattern that is the composite of the masks 106 and 122 (illustrated in FIGS. 7 and 11, respectively). Mask 106 provides the cuts in the Y-direction in portions of selected ones of the fins as required by the logic portion and memory portions of an IC (see FIGS. 6 and 9) to isolate between transistors of like doping type, and mask 122 removes dummy fins in the X-direction to isolate between transistors of opposite doping type.

The composite mask is used as an etch mask to etch through the OPL layer and to etch selected portions of the selected fins exposed through the mask. As noted above, a process for completely removing the selected fins and portions of fins would be complex and difficult carry out with high yield. In accordance with this embodiment, however, the fins are only partially removed. The top portion of the selected fins is etched to reduce the height of the fins to a height such as indicated by arrow 128 in FIG. 19. After etching selective fins in this manner, the method in accordance with this embodiment continues in the same way as illustrated in FIGS. 16-20.

While at least one exemplary embodiment has been presented in the foregoing detailed description, it should be appreciated that a vast number of variations exist. For example, the foregoing description specifically details method steps for the fabrication of a FinFET IC that includes both a logic portion and a memory portion, specifically an SRAM portion. The invention is also applicable to IC that include only a logic portion or only a memory portion and to ICs in which the memory portion is of some other configuration than an SRAM. Additionally, the foregoing description details steps by which the patterned hard mask is formed by a SIT process, but those of skill in the art will understand that there are other methods to form the hard mask. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating a FinFET integrated circuit comprising:
   providing a semiconductor substrate;
   forming a patterned hard mask overlying the semiconductor substrate, the patterned hard mask defining locations of a regular array of a plurality of fins;
   removing portions of the patterned hard mask using a cut mask to form a modified hard mask;
   etching the substrate using the modified hard mask as an etch mask to form a plurality of fins extending upwardly from the substrate and separated by trenches;
   at least partially removing selected ones of the plurality of fins to form isolation regions; and
   depositing an insulating material to fill the trenches and to cover the at least partially removed selected ones of the plurality of fins,
   wherein at least partially removing selected ones of the plurality of fins comprises:
      etching dummy fins positioned between regions of the integrated circuit comprising transistors of opposite polarity;
      etching portions of ones of the plurality of fins to provide isolation between transistors of the integrated circuit of the same polarity;
      depositing an organic planarizing layer to fill the trenches;

forming a photolithographic mask layer overlying the organic planarizing layer and exposing a portion of the organic planarizing layer overlying dummy fins and a portion of the organic planarizing layer overlying the portions of ones of the plurality of fins;

etching the organic planarizing layer and a top portion of the dummy fins and a top portion of the portions of ones of the plurality of fins;

removing the organic planarizing layer;

partially filling the trenches with a flowable chemical vapor deposited oxide;

depositing a high density plasma oxide overlying the flowable chemical vapor deposited oxide; and planarizing the high density plasma oxide and removing a top portion of the fins.

2. The method of claim 1 wherein forming a patterned hard mask comprises:

depositing a layer of hard mask material overlying the semiconductor substrate;

depositing a layer of mandrel-forming material overlying the layer of hard mask material;

patterning the layer of mandrel-forming material to form a plurality of mandrels;

forming sidewall spacers on the mandrels;

removing the mandrels; and etching the layer of hard mask material using the sidewall spacers as etch masks.

3. The method of claim 1 wherein forming a patterned hard mask comprises forming a plurality of elongated, substantially parallel hard masks extending in a first direction.

4. The method of claim 3 wherein removing portions of the patterned hard mask comprises removing portions of the patterned hard mask with a cut mask aligned substantially along a second direction perpendicular to the first direction to define regions of isolation between transistors of like polarity.

5. The method of claim 1 forming a patterned hard mask comprises forming a first plurality of elongate, substantially parallel lines having a first line-space pitch and a second plurality of elongate, substantially parallel lines having a second line-space pitch different than the first line-space pitch.

6. The method of claim 5 wherein removing portions of the patterned hard mask comprises using a first cut mask in the first plurality of elongate, substantially parallel lines and a second cut mask in the second plurality of elongate, substantially parallel lines.

7. The method of claim 1 wherein depositing an insulating material comprises:

depositing an oxide to fill the trenches between fins;

planarizing the oxide;

removing any patterned hard mask remaining on the fins; and recessing the oxide to expose a top portion of the fins.

8. A method for fabricating a FinFET integrated circuit comprising:

providing a semiconductor substrate;

etching trenches into the semiconductor substrate to form a plurality of fins having a first height;

etching selected ones of the plurality of fins to reduce the height thereof to a second height less than the first height;

depositing an insulator material to form an insulator layer having a thickness greater than the first height and covering the selected ones of the plurality of fins, wherein etching selected ones of the plurality of fins comprises:

etching dummy fins positioned between regions of the integrated circuit comprising transistors of opposite polarity;

etching portions of ones of the plurality of fins to provide isolation between transistors of the integrated circuit of the same polarity;

depositing an organic planarizing layer to fill the trenches;

forming a photolithographic mask layer overlying the organic planarizing layer and exposing a portion of the organic planarizing layer overlying dummy fins and a portion of the organic planarizing layer overlying the portions of ones of the plurality of fins;

etching the organic planarizing layer and a top portion of the dummy fins and a top portion of the portions of ones of the plurality of fins;

removing the organic planarizing layer;

partially filling the trenches with a flowable chemical vapor deposited oxide;

depositing a high density plasma oxide overlying the flowable chemical vapor deposited oxide; and planarizing the high density plasma oxide and removing a top portion of the fins.

9. The method of claim 8 wherein etching trenches comprises:

forming a silicon nitride hard mask comprising a first plurality of parallel lines having a first line-space pitch for forming a logic portion of the integrated circuit and a second plurality of parallel lines having a second line-space pitch different than the first line-space pitch for forming a memory portion of the integrated circuit; and etching the semiconductor substrate using the silicon nitride hard mask as an etch mask.

10. The method of claim 8 wherein depositing an insulator material comprises:

filling the trenches with an oxide;

planarizing the oxide; and removing a top portion of the oxide to expose a top portion of the plurality of fins other than the selected ones.

11. The method of claim 8 further comprising removing a top portion of the planarized high density plasma oxide to expose a top portion of the semiconductor fins.

12. A method for fabricating a FinFET integrated circuit comprising:

providing a semiconductor substrate;

forming a first mask overlying the semiconductor substrate and defining a plurality of parallel fin locations extending in a first direction and selectively cut in a second direction;

etching the semiconductor substrate using the first mask as an etch mask to form a plurality of parallel fins extending in a first direction and separated by etched trenches, at least selected ones of the parallel fins being terminated in the second direction;

forming a second mask overlying the fins and exposing dummy ones of the plurality of parallel fins;

etching at least a portion of the dummy ones of the plurality of parallel fins to reduce the height thereof; and filling the trenches and covering the etched dummy ones with an insulating material, wherein etching at least a portion of the dummy ones of the plurality of fins comprises:

etching portions of the dummy ones of the plurality of fins to provide isolation between transistors of the integrated circuit of the same polarity;

depositing an organic planarizing layer to fill the trenches;

forming a photolithographic mask layer overlying the organic planarizing layer and exposing a portion of the organic planarizing layer overlying the dummy ones;

etching the organic planarizing layer and a top portion of the dummy ones;

removing the organic planarizing layer;

partially filling the trenches with a flowable chemical vapor deposited oxide;

depositing a high density plasma oxide overlying the flowable chemical vapor deposited oxide; and planarizing the high density plasma oxide and removing a top portion of the fins.

13. The method of claim 12 further comprising etching the insulating material to expose a top portion of the plurality of parallel fins but leaving the insulating material overlying the etched dummy ones.

14. The method of claim 12 wherein forming a first mask comprises forming a first mask defining a first group of fin locations having a first line-space pitch and a second group of fin locations having a second line-space pitch different than the first line-space pitch.

15. The method of claim 12 wherein forming a first mask comprises depositing a layer of silicon nitride overlying the semiconductor substrate and patterning the layer of silicon nitride by a sidewall image transfer technique.

* * * * *